United States Patent [19]

Van Rooy

[11] Patent Number: 4,757,373
[45] Date of Patent: Jul. 12, 1988

[54] AMPLIFIER CIRCUIT OPERATIVE WITH AN ADAPTIVE SIGNAL COMPRESSION

[75] Inventor: Johannes H. J. M. Van Rooy, Breda, Netherlands

[73] Assignee: U.S. Philips Corporation, New York, N.Y.

[21] Appl. No.: 928,339

[22] Filed: Nov. 7, 1986

[30] Foreign Application Priority Data

Nov. 14, 1985 [NL] Netherlands ............... 8503129

[51] Int. Cl.⁴ ..................... H04N 5/10; H04N 9/64
[52] U.S. Cl. ............................... 358/37; 358/166
[58] Field of Search .............. 358/27, 36, 37, 166, 358/167; 330/254, 295, 124 R

[56] References Cited

U.S. PATENT DOCUMENTS

| | | | |
|---|---|---|---|
| 4,245,237 | 1/1981 | Lagoni | 358/31 |
| 4,388,647 | 6/1983 | Harwood et al. | 358/166 |
| 4,394,744 | 7/1983 | Wrench, Jr. | 358/166 |
| 4,623,924 | 11/1986 | Wargo et al. | 358/37 |
| 4,639,781 | 1/1987 | Rucci et al. | 358/166 |

Primary Examiner—James J. Groody
Assistant Examiner—Robert M. Bauer
Attorney, Agent, or Firm—Marc D. Schechter; Gregory P. Gadson

[57] ABSTRACT

The circuit has a gain factor characteristic curve with various breakpoints below which and above which a larger or a smaller gain factor, respectively, is present. Both the breakpoints and the gain factors above these points are variable dependent on the magnitude of the input signal. For picture signal processing for which the signal values below the breakpoints reach the output signal in an optimum way and above which an optimum adaptive white signal compression is present, the circuit is formed with a signal multiplier circuit (2) for multiplying a picture voltage (VI) and a first direct voltage (Va) by a control voltage (VR), and with a signal minimum detection circuit (4) for passing the lowest voltage value when the said picture voltage (VI) is applied relative to the voltage originating from the signal multiplier circuit (2) and relative to a second direct voltage (Vb), with the control voltage (VR) being derived from the voltage value that has been passed.

9 Claims, 3 Drawing Sheets

AMPLIFIER CIRCUIT OPERATIVE WITH AN ADAPTIVE SIGNAL COMPRESSION

BACKGROUND OF THE INVENTION

The invention relates to an amplifier circuit operative with an adaptive signal compression, a signal amplifier being arranged between a signal input and a signal output with a gain factor characteristic curve having a gain factor which is larger and smaller, respectively, below and above a breakpoint, the amplifier being formed with signal combination circuits by which both the breakpoint and the gain factor above the breakpoint are variable for the adaptive signal compression, a smaller gain factor being present above the breakpoint in the case of a higher breakpoint.

A circuit of this type, particularly for use in television is described in U.S. Pat. No. 4,245,237. FIG. 7 of this Patent shows the described gain factor characteristic curve. In addition to the three breakpoints shown for the adaptive signal compression the characteristic curve shows a single breakpoint at a small input signal above which three larger gain factors are present relative to a smaller gain factor therebelow. The three breakpoints for the signal compression occur at one given value of the input signal.

To obtain the described characteristic curve the signal amplifier is formed with the signal combination circuits in the form of subtractor and adder circuits and a non-linear signal processing circuit. Combination of the input signal and the non-linear signal derived therefrom ultimately leads to the output signal to which the described gain factor characteristic curve applies.

In accordance with the said Patent the amplifier circuit described is used to process vertical detail information in a video signal. Signals having small amplitudes are processed with a given gain factor, whilst signals having larger amplitudes are processed with a larger gain factor and signals with the largest amplitudes are processed with a smaller gain factor. In television display it is achieved that for small signal values there is no unacceptable noise in the television picture, whilst the vertical details are displayed in a pronounced manner at mean signal values and the vertical details do not lead to blooming due to the adaptive compression at the highest signal values. As far as the choice of the given gain factor characteristic curve is concerned, the adaptive signal compression can be set by using a variable resistor.

SUMMARY OF THE INVENTION

It is an object of the invention to realize an amplifier circuit operative with several breakpoints for the adaptive signal compression, which in a simple embodiment is particularly suitable for processing a picture or video signal. To this end an amplifier circuit according to the invention is characterized in that the signal amplifier operative with an adaptive white signal compression for a picture signal is formed with signal combination circuits in the form of a signal multiplier circuit for multiplying a picture voltage and a first more or less constant direct voltage, respectively, by a control voltage, and a signal minimum detection circuit for passing the lowest voltage value upon the supply of the said picture voltage relative to the voltage originating from the signal multiplier circuit and relative to a second more or less constant direct voltage, the control voltage being derived via a control circuit from the voltage value that has been passed.

The use of the controlled signal multiplier circuit and the signal minimum detection circuit leads to an output signal of the amplifier circuit which follows the variations in the input signal in an optimum way below the breakpoints and has an adaptive white limitation above the breakpoints. In practice it is found that upon display the output picture signal results in a picture whose quality is considerably improved.

An embodiment of the amplifier circuit according to the invention having a minimum possible number of circuit components is characterized in that the signal multiplier circuit is formed with an input for the supply of the picture voltage minus the first more or less constant direct voltage, which voltage is supplied by a subtractor circuit as a signal combination circuit, and a further input for the supply of the control voltage, an output of said circuit being coupled to an input of an adder circuit as a signal combination circuit, another input of which receives the second more or less constant direct voltage and an output of which is coupled to an input of the signal minimum detection circuit, another input of which receives the said picture voltage.

An embodiment of the circuit having a simple design of the signal multiplier circuit is characterized in that the signal multiplier circuit is formed with emitter-coupled transistors whose bases are connected to respective inputs thereof, with a current source transistor connected to the emitters and with a current-mirror output, the control voltage being applied to the current source transistor and the current-mirror circuit output being connected via a resistor to a voltage terminal carrying the second more or less constant direct voltage, said current-mirror circuit output being furthermore connected to an input of the signal minimum detection circuit.

An embodiment of the circuit in which the input signal variations below the breakpoints reach the output signal in an optimum way is characterized in that the signal minimum detection circuit is formed with two transistors having parallel connected emitters and collectors, the bases constituting the inputs of the signal minimum detection circuit and the emitters being connected via a resistor to a supply voltage terminal, said emitters being connected to the output of the signal minimum detection circuit.

A further embodiment in which the control of the amplifier circuit above the breakpoints in the case of a rigorous signal limitation is only dependent on the duration of a given direct voltage being exceeded is characterized in that the output of the signal minimum detection circuit with the emitter connection is connected to an emitter of a transistor which is disposed in the control circuit for applying the said control voltage to an output, the base of said transistor being connected to a terminal carrying a reference direct voltage and the collector being connected to a signal-integrating circuit whose output constitutes the output of the control circuit.

Still another embodiment in which the control of the amplifier circuit above the breakpoints is dependent on the duration and the extent to which a given direct voltage is exceeded is characterized in that an emitter-follower output of the signal minimum detection circuit with the emitter connection is connected to a base of a first transistor disposed in the control circuit for applying the said control voltage to an output, the emitter of said first transistor being connected to the emitter of a second transistor, the control circuit including a third transistor, the bases of the second and third transistors being connected to a terminal carrying a reference direct voltage, the emitters of the first and second transistors and the emitter of the third transistor being connected to respective inputs of a differential amplifier forming part of a signal-integrating circuit whose output constitutes the output of the control circuit.

A further embodiment suitable for use in colour television is characterized in that the amplifier circuit includes at least two signal channels each comprising the signal multiplier circuit and the minimum detection circuit, the control circuit being formed with an input for each signal channel, each with the associated transistor, the collectors of said transistors being connected together.

A further embodiment with an easily adjustable discharge time constant in the signal-integrating circuit is characterized in that the signal-integrating circuit is formed with a differential amplifier and a capacitor between an amplifier input and output and that the relevant amplifier input is connected via a variable resistor to a supply voltage terminal.

An embodiment of the signal amplifier circuit which leads to an optimum quality improvement in practice upon display of the output picture signal is characterized in that the discharge time constant of the signal-integrating circuit is of the order of several television field periods.

BRIEF DESCRIPTION OF THE DRAWINGS

The invention will be further described by way of example with reference to the accompanying drawings in which.

DETAILED DESCRIPTION OF THE INVENTION

Figure 1:
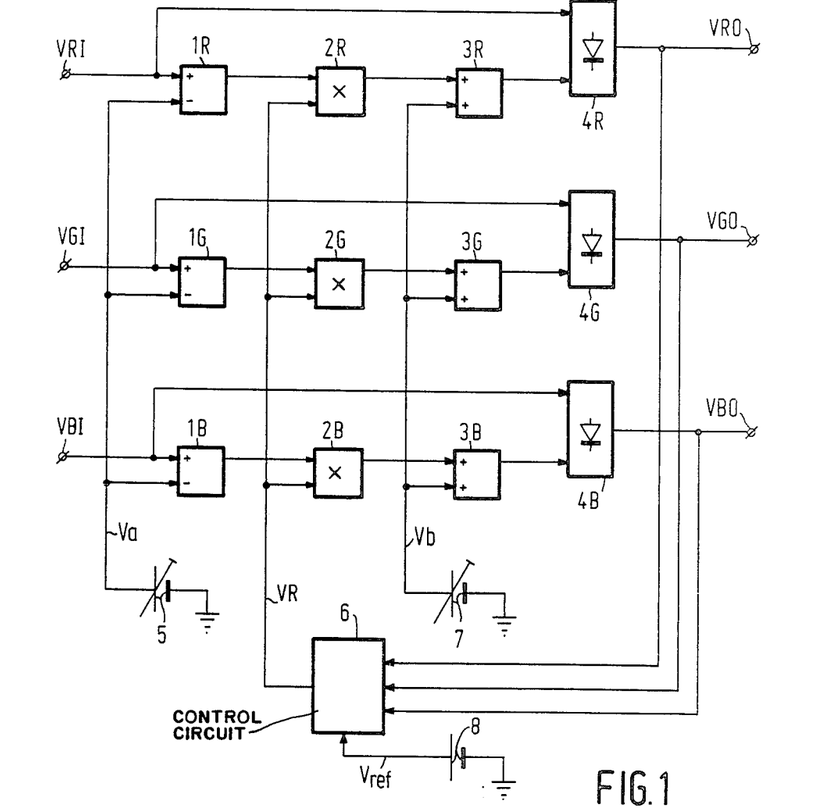
FIG. 1 is a block diagram of an embodiment of an amplifier circuit according to the invention, particularly suitable for colour television and formed with several signal channels for that purpose.

The amplifier circuit shown in FIG. 1 has three signal inputs VRI, VGI and VBI and three signal outputs VRO, VGO and VBO, whilst the signals occurring in at the inputs (VI) and the outputs (VO) are denoted by the same reference numerals. The input signals VRI, VGI and VBI are colour signals representing the red, green and blue information components, respectively, in colour television and being present, for example, in a colour television camera. The input signal VI is generally a picture signal which is, for example, a colour signal in colour television and is indicated as a luminance signal in black and white television. The picture signal VI is associated with picture information to be displayed in a television system for broadcasting or security control purposes, for X-ray or infrared picture display or for display of a different type. It is assumed that the picture signal VI has very large signal variations. These very large signal variations may occur particularly in the case of scene recordings outside broadcast studios and in the case of outdoor security control cameras. An example is bright car headlights by night. The same applies to television recordings of the display screen of an X-ray image intensifier or of an infrared sensor.

A series arrangement of a subtractor circuit 1R, a signal multiplier circuit 2R, an adder circuit 3R and a signal minimum detection circuit 4R which furthermore has an input which is directly coupled to the input VRI is provided between the signal input VRI and the signal output VRO of FIG. 1. Similarly, the circuits 1G, 2G, 3G and 4G and 1B, 2B, 3B and 4B are provided between the inputs VGI and VBI and the outputs VGO and VBO, respectively. Thus, a signal channel (1-4) is present between the input VI and the output VO, which circuit comprises as signal combination circuits the subtractor circuit 1, the signal multiplier circuit 2, the adder circuit 3 and the signal minimum detection circuit 4. The signal channel (1R-4R) of the signal amplifier of FIG. 1 with the three signal channels (1-4) will be further described in detail by way of example. The (+) input of the subtractor circuit 1R is connected to the input VRI, the (−) input being connected to a voltage terminal of a voltage source 5. The adjustable voltage source 5 supplies a more or less constant direct voltage Va relative to ground. The output of the subtractor circuit 1R with the signal (VRI-Va) is connected to an input of the signal multiplier circuit 2R denoted by X, another input of which receives a control voltage VR from a control circuit 6. The output of the signal multiplier circuit 2R with the signal VR. (VRI-Va) is connected to a (+) input of the adder circuit 3R another (+) input is connected to a voltage terminal of a voltage source 7. The adjustable voltage source 7 supplies a more or less constant direct voltage Vb relative to ground. The output of the adder circuit 3R with the signal VR. (VRI-Va)+Vb is connected to an input of the signal minimum detection circuit 4R designated by means of a diode, another input of which receives the signal VRI. Consequently the output signal VRO always has the lowest value from the two signals applied to the circuit 4R. Generally it holds for the signal channels (1-4) that the lowest values originating from the signal VI or from the signal VR. (VI-Va)+Vb occurs in the output signal VO. The control circuit 6 supplies the control voltage VR while the signals VRO, VGO and VBO and a reference direct voltage $V_{ref}$ from a voltage source 8 are applied. The control circuit 6 will be further described in two embodiments in FIGS. 4 and 5. For the operation of the control circuit 6 it holds that the control voltage VR is adapted after one or more of the signals VRO, VGO and VBO whereafter the control voltage VR goes to a given rest value when the signals do not exceed the reference direct voltage.

Figure 2:
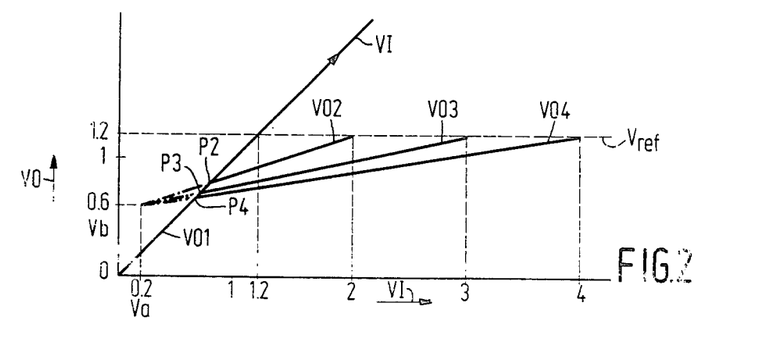
FIG. 2 shows a gain factor characteristic curve associated with the circuit of FIG. 1.

The structure of the signal channels (1-4) shown in FIG. 1 between the input VI and the output VO and the use of the voltage sources 5, 7 and 8 and the control circuit 6 is associated with a gain factor characteristic curve for the signal channels (1-4) shown in FIG. 2. In FIG. 2 the output signal VO is plotted with respect to the input signal VI. The Figure shows that the input signal VI may reach a value which is four times as high as a nominal value denoted by 1. The output signal VO then has a variation from 0 to 1.2 times the nominal value of 1, which 1.2-value is equal to the reference direct voltage $v_{ref}$. It is assumed as an example that the nominal value of 1 is equal to a voltage of 0.5 V. In FIG. 2 the direct voltage Va with a normal 0.2-value which is equal to 0.1 V is plotted on the VI- axis. The direct voltage Vb with a normalized 0.6-value which is equal to 0.3 V and with $V_{ref}$ being equal to 0.6 V is plotted on the VO-axis. FIG. 2 shows that the gain factor is equal to VO1 for input signal variations (VI) between 0 and the 1.2 value. When input signal variations (VI) up to the 2-value occur for some time, the gain factor characteristic curve with a variation (VO1, VO2) with a breakpoint P2 being present will occur in an ultimate state of balance with the associated value of the control voltage VR. Input signal variations (VI) up to the 3-value lead to the gain factor characteristic curve (VO1, VO3) after some time, with the breakpoint P3. Likewise input signal variations (VI) up to the 4-value lead to the gain factor characteristic curve (VO1, VO4) with the breakpoint P4. It appears from FIG. 2 that for an input picture signal VI with a possible variation up to 4 times the nominal value the output picture signal VO has a variation up to 1.2 times the nominal value. In television the 1.2 value is denoted as the peak-white level, the value 1 as the white level and the value 0 as the black level. Furthermore, it appears that there is an adaptive signal compression above the breakpoints P2, P3 and P4. The characteristic curves with the gain factors VO2, VO3 and VO4 meet at one point which is defined by VI=Va and VO=Vb. Since the input picture signal VI is applied to one input of the signal minimum detection circuit 4 and the signal from the circuit 3 having a variation in accordance with the characteristic curve VO2, VO3 or VO4 is applied to the other input, the lowest value occurs in the output picture signal VO. Dependent on the magnitude of the control voltage VR, the input picture signal VI applies in a direct manner its value in the output picture signal VO up to the 1.2 value or up to one of the breakpoints P2, P3 and P4. Consequently, the variations in the input picture signal VI up to these values directly reach the output picture signal VO so that these variations are followed in an optimum manner. The breakpoints P2, P3 and P4 may be arbitrarily adjusted, via the adjustment of the direct voltages Va and Vb, to a value at which an optimum quality improvement in the display of the output picture signal VO is obtained.

Figure 3:
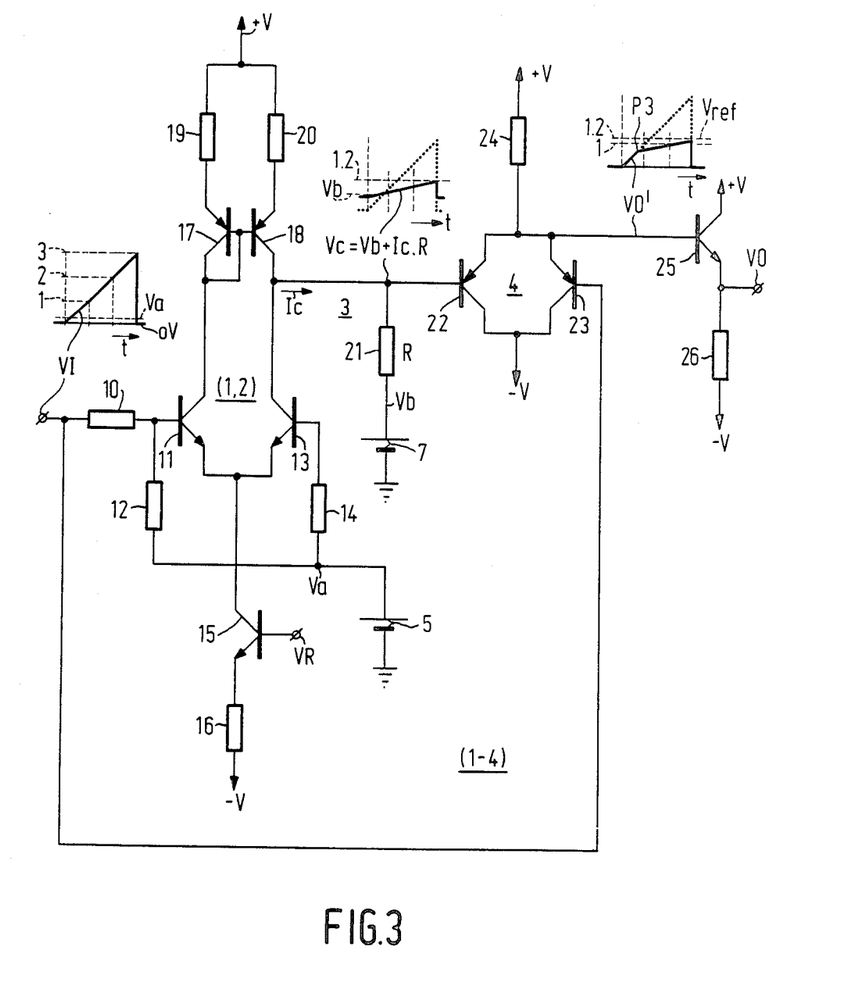
FIG. 3 shows a circuit diagram of an amplifier circuit according to the invention and of a signal channel of the circuit according to FIG. 1.

FIG. 3 shows a circuit diagram of an amplifier circuit according to the invention for one of the signal channels (1–4) of the amplifier circuit according to FIG. 1. To explain the operation of the circuit according to FIG. 3 and the structure obtained for the characteristic curves according to FIG. 2, FIG. 3 shows some signals as a function of time t. The input picture signal VI is shown with a voltage linearly varying in time t from the value 0V up to three times the nominal value 1 given by way of example. It is assumed that the linear voltage variation shown occurs over a part of a television line period and during a number of line periods which is large enough to cause the control circuit 6 of FIG. 1 to supply a control voltage VR which is associated with the input signal exceeding three times the nominal value. The part of the line periods within the number of line periods is associated with a region of the displayed picture. The voltage Va is denoted at the input signal VI. With respect to FIG. 1, FIG. 3 shows the voltage sources 5 and 7 for supplying the respective voltages Va and Vb, a combined subtractor and multiplier circuit (1, 2), the adder circuit 3 and the minimum detection circuit 4.

In FIG. 3 the signal input VI is connected via a resistor 10 to the base of an npn-transistor 11 which is furthermore connected via a resistor 12 to the terminal carrying voltage Va of the voltage source 5. The emitter of the transistor 11 is connected to the emitter of a transistor 13 whose base is connected via a resistor 14 to the terminal carrying the voltage Va. The emitters of the emitter-coupled transistors 11 and 13 are connected to a collector of an npn-transistor 15 which operates as a current source transistor under the control of the control voltage VR which is applied to its base. The emitter of the transistor 15 is connected via a resistor 16 to a supply voltage terminal −V. The terminal −V forms part of supply voltage source V not shown, a terminal of which is considered to be connected to ground. Supply voltage V=5 V is given by way of example.

The collectors of transistors 11 and 13 are connected to the collectors of pnp-transistors 17 and 18, respectively, whose bases are connected together and are connected to the collector of transistor 17. The emitters of transistors 17 and 18 are connected via resistors 19 and 20, respectively, to a supply voltage terminal +V. The components 10 through 20 combined constitute the combined subtractor and multiplier circuit (1, 2) in which the transistors 11 and 13 operate as a differential amplifier (11, 13). Due to the voltage division across the resistors 10 of, for example, 1000 ohms and 12 of, for example, 10 ohms, 1% of the voltage VI and 99% of the voltage Va occurs at the base of transistor 11. Via the resistor 14 whose value is equal to that of the resistor 12, 100% of the voltage Va occurs at the base of the transistor 13. The differential amplifier (11, 13) processes the differential value which is equal to 1% of (VI-Va). Furthermore the circuit (1, 2) operates in known manner with the multiplication VR multiplied by (VI-Va). A current Ic corresponding to this multiplication is applied by the transistors 18 and 13 to a resistor 21 whose other end is connected to a terminal carrying the voltage Vb of the voltage source 7. The current Ic is obtained via a current mirror circuit (17–20) present in the circuit (1, 2).

The junction of the collectors of the transistors 18 and 13 and of the resistor 21 carries a voltage Vc=Vb+Ic. R shown next to it as a function of time t, wherein R represents the value of the resistor 21. The voltage Vc is shown in relation to the input picture voltage VI shown in a broken line. It appears that the voltage Vc has a linear variation dependent on the current Ic which in its turn depends on the product VR. (VI-Va) with the indicated direct voltage Vb being located at a centre of rotation of the variation shown. A comparison of the characteristic curves shown in FIG. 2 (with the factors VO2, VO3 and VO4) with the voltage Vc=Vb+Ic. R, wherein Ic is dependent on the product VR. (VI-Va) shows how the set of characteristic curves has been obtained with (Va, Vb) as the starting point. A given centre of rotation (Va, Vb) is optionally adjustable with the aid of the adjustable voltage sources 5 and 7. FIG. 2 shows as an example the centre of rotation (Va, Vb) with the normalized values (0.2, 0.6). An increase of the voltage Va up to the 0.6-value causes the centre of rotation to be located on the characteristic curve VI and results in one single breakpoint. A further increase of the voltage Va again results in various breakpoints which are below the values Va and Vb. Optionally, the voltages Va and Vb can be adjusted dependent on the picture content for obtaining the optimum picture quality upon display.

The changing voltage Vc is applied to an input of the minimum detection circuit 4, more specifically to the base of a pnp-transistor 22 present therein. The circuit 4 includes a second pnp-transistor 23 whose parallel connected collectors and emitters are connected directly and via a resistor 24, respectively to supply terminals −V and +V, respectively. The other input of the circuit 4 is constituted by the base of the transistor 23 and is connected to the picture signal input VI. The output of the circuit 4 is constituted by the emitter connection of the transistors 22 and 23 and is connected to the base of an emitter-follower transistor 25 of the npn-type. The collector of the transistor 25 is connected directly to the supply voltage terminal +V and the emitter is connected via a resistor 26 to the terminal −V. The base and the emitter of the transistor 25 carry signals VO' and VO, respectively. The emitter-follower transistor 25 can be considered to be incorporated in the minimum detection circuit 4 as applies to each of the circuits 4R, 4G and 4B of FIG. 1, or there may be a separate output for the signal VO'. FIG. 3 shows the signal VO' with a voltage variation as occurs in accordance with the gain factor characteristic curve (VO1, VO3) of FIG. 2 with the breakpoint P3. The signal VO has the same voltage variation which is a base-emitter voltage drop lower. The base currents are considered to be negligible in the foregoing.

Figure 4:
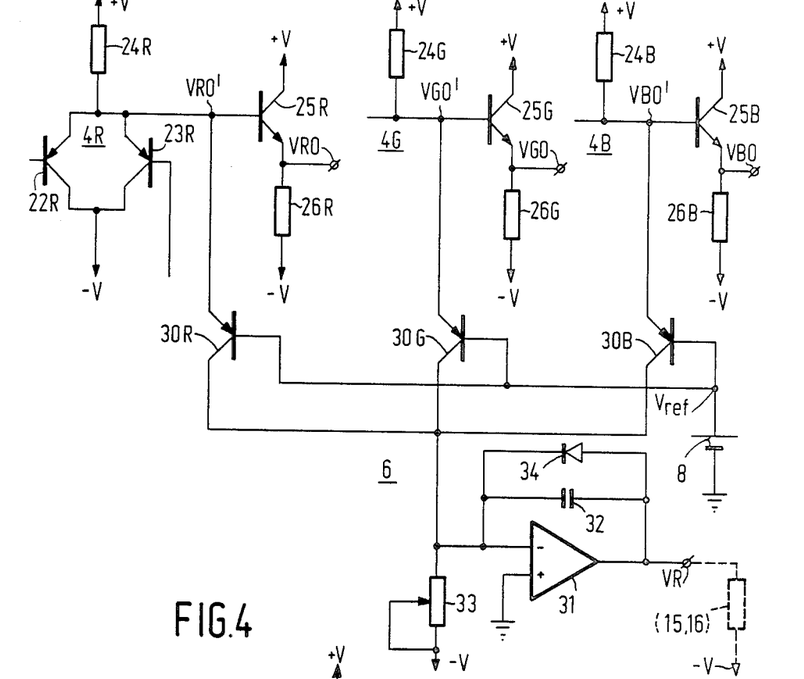
FIG. 4 shows a circuit diagram of an embodiment of a control circuit disposed in the circuit according to FIG. 1.

FIG. 4 shows a circuit diagram for a possible embodiment of the control circuit 6 of FIG. 1. The minimum detection circuits 4R, 4G and 4B are shown in accordance with FIG. 3 and each have an output connected to the emitter-connection of the transistors 22 and 23 carrying the respective signals VRO', VGO' and VBO'. The control circuit 6 is formed with three pnp-transistors 30R, 30G and 30B to the emitters of which the respective signals VRO', VGO' and VBO' are applied. The bases of the transistors 30 are connected to the terminal carrying the reference direct voltage $V_{ref}$ of the voltage source 8. The collectors of the transistors 30 are connected to the (−) input of a differential amplifier 31. The (−) input of the differential amplifier 31 is connected via a capacitor 32 to the output thereof and is connected via a variable resistor 33 to the supply voltage terminal −V. The output of the differential amplifier 31 is connected for limiting purposes to the anode of a diode 34 whose cathode is connected to the (−) input. The (+) input of the differential amplifier 31 is connected to ground and its output constitutes the output of the control circuit 6 carrying the control voltage VR. The control circuit 6 of FIG. 4 comprises a signal-integrating circuit (31–34). FIG. 4 shows in relation to the diagram of FIG. 3 the load of the control voltage VR by means of a resistor (15, 16) in broken lines.

To explain the operation of the control circuit 6 in accordance with FIG. 4 the starting point is a rest state in which all voltages VO' are lower than the voltage $V_{ref}$ so that all transistors 30 are non-conducting. The emitter-base threshold voltage in the transistors 30 is not taken into account. This rest state implies that the ground potential occurs at the (−) input of the differential amplifier 31 whilst due to the limiting operation of the conducting diode 34 the voltage drop thereacross produces an equally large voltage in the control voltage VR. The gain factor VO1 of FIG. 2 is present in all three signal channels (1–4) of FIG. 1.

Subsequently it is assumed that the input signal variation (VI) up to three times the nominal value occurs for some time as is also assumed in FIG. 3. This large variation may occur in one or more of the signals VRO', VGO' and VBO' of FIG. 4. The output picture signal VO' of FIG. 3 occurs in the signal channel or signal channels to which the input signal VI shown is applied. At the instants when one (or more) of the signals VRO', VGO' and VBO' tends to exceed the voltage $V_{ref}$, the relevant transistor 30 becomes conducting with a charge current for the capacitor 32. Apart from the emitter-base threshold voltage, the voltage at the emitter of the conducting transistor 30 cannot exceed the voltage $V_{ref}$. The current through the transistor 30 is then limited to a maximum value by the resistor 24. The value of the resistor 24 is equal to 4700 Ohms which is given by way of example. The transistor current leads to a decrease of the voltage across the capacitor 32. This voltage decrease continues until the charge applied by means of the charge current via the resistor(s) 24 to the capacitor 32 is equal to the charge removed from the capacitor 32 by means of the discharge current via the resistor 33. The ultimately lower control voltage VR obtained in the balanced state is associated with the gain factor characteristic curve VO3 of FIG. 2. The signal limitation obtained by the transistor 30 of FIG. 4 causes the signals VRO, VGO and VBO to be limited rigorously.

When subsequently all of the signals VRO', VGO' and VBO' have such a low value that none of the transistors 30 conducts anymore, the capacitor 32 will be discharged across the resistor 33 during this time until the said rest state is reached. The extent of the discharge is dependent on the discharge time constant of the integrating circuit (31–34). It is found in practice that a choice of the order of various television field periods yields an optimum improvement of the quality when the output picture signals VO are displayed. A discharge time constant of the order of 0.1 to 1 s is the result for 50 and 60 Hz television systems. A readjustment of the variable resistor 33 may be utilized to obtain the desired discharge time constant. Example values are a capacitor 32 of 1 $\mu$F and a resistor 33 which is adjustable between $1.10^5$ nand $1.10^6$ Ohm.

Figure 5:
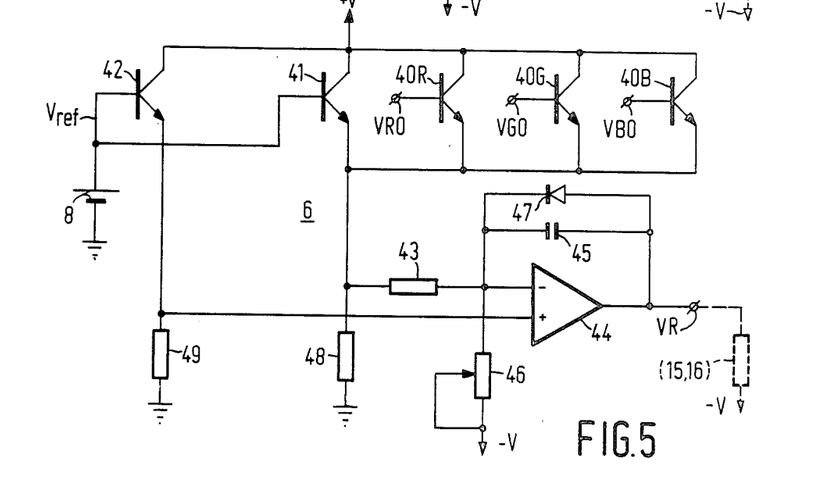
FIG. 5 shows a circuit diagram of a further embodiment of the control circuit.

A further embodiment of a control circuit 6 according to FIG. 1 is shown in the circuit diagram according to FIG. 5. The output signals VRO, VGO and VBO corresponding to those of FIG. 3 and originating from emitter follower outputs (25, 26) present in the signal minimum detection circuits 4R, 4G and 4B are applied to bases of npn- transistors 40R, 40G and 40B, respectively. The transistors 40 have coupled emitters and coupled collectors which are connected to the supply voltage terminal +V. Arranged in parallel therewith is an npn-transistor 41 to whose base the voltage $V_{ref}$ is applied. Furthermore the voltage $V_{ref}$ is applied to the base of an npn-transistor 42 whose collector is connected to the supply voltage terminal +V. The emitters of the transistors 40 and the transistor 41 are connected via a resistor 43 to a (−) input of a differential amplifier 44. The (−) input is connected via a capacitor 45 to the amplifier output and is connected via a variable resistor 46 to the supply voltage terminal −V. For limiting purposes the output of the differential amplifier 44 is connected to the anode of a diode 47 whose cathode is connected to the (−) input. The emitters of the transistors 40 and the transistor 41 are connected to ground via a resistor 48. The emitter of the transistor 42 is connected to the (+) input of the differential amplifier 44 and is connected to ground via a resistor 49. FIG. 5 shows a signal-integrating circuit (43–48) in which the resistor 46 functions as a current source. Likewise as in FIG. 4, FIG. 5 shows the load (15, 16) by means of broken lines.

To explain the operation of the control circuit 6 of FIG. 5 the starting point is the rest state as described with reference to FIG. 4. None of the transistors 40 conducts and, while subtracting the base-emitter threshold voltage Vd at the transistor 42, the voltage $V_{ref}$-Vd occurs at the (+) input of the differential amplifier 44. The transistor 41 also conducts leading to the voltage $V_{ref}$-Vd being present at the (−) input and via the limiting diode 47 with a voltage drop which is equal to Vd, the output of the differential amplifier 44 carrying the voltage $V_{ref}$. The control voltage VR is then present at the rest value $V_{ref}$.

When a base voltage at one of the transistors 40 exceeds the voltage at their emitters, the relevant transistor 40 becomes conducting whilst the current value is dependent on the magnitude by which the base voltage exceeds the emitter-voltage. Consequently capacitor 45 receives a charge current which is dependent on the extent by which this voltage is exceeded. This is in contrast to the embodiment of the control circuit 6 described with reference to FIG. 4 in which only the charge period is decisive, but in which more than one transistor 30 can conduct. In the embodiment of FIG. 5 only the transistor 40 conducts that has the highest voltage on its base. The result is that a balanced state is ultimately achieved, with the charge applied via the resistor 43 to the capacitor 45 being equally large as the charge removed via the resistor 46. In this balanced state the control voltage VR has a lower value than the voltage $V_{ref}$.

After one of the transistors 40 subsequently does not become conducting anymore, the control voltage VR goes to the rest state dependent on the discharge time constant defined by the values of the capacitor 45 and the resistor 46. As is described with reference to FIG. 4 it is favourable to choose the discharge time constant of the order of several television field periods. When the control circuit 6 of FIG. 5 is used, it is found in practice that a time constant of between 10 and 100 ms is satisfactory. A value of 0.1 µF for the capacitor 45 and a value of between $1.10^5$ and $1.10^6$ Ohm for the resistor 46 are given by way of example. The charge resistor 43 may have a value of 4700 Ohm. The resistors 48 and 49 have values of, for example, $1.10^4$ Ohm.

In summary, it is found that the control circuit of FIG. 4 is operative with one or more simultaneously conducting transistors 30 with a maximum limited charge current per transistor and a rigorous signal limitation. Related to a displayed picture there is only a picture surface dependence during control. In the control circuit of FIG. 5 only one of the transistors 40 is each time conducting whilst the charge current is dependent on the extent by which the reference voltage is exceeded. Related to a displayed picture there is a picture surface dependence for the locally brightest picture surfaces only and a dependence on the extent by which the reference voltage is exceeded.

The circuit diagram of FIG. 1 is shown with a minimum possible number of circuit components and its operation is based on the minimum detection between the signal VR·(VI-Va)+Vb and the signal VI. In one embodiment with two multiplier circuits the products VR·VI and VR·Va may be formed separately. Furthermore, it is possible to perform the minimum detection between the signal VR·VI-VR·Va and the signal VI-Vb or between the signal VR·VI+Vb and the signal VI+VR·Va. For all these cases there applies that the minimum detection circuit is operative for passing the lowest voltage value when the input picture voltage VI is applied relative to the voltage VR·VI and VR·Va, respectively, originating from the signal multiplier circuit and relative to the constant direct voltage Vb.

I claim:

1. An amplifier circuit operative with an adaptive signal compression, a signal amplifier being arranged between a signal input and a signal output with a gain factor characteristic curve having a gain factor which is larger or smaller, respectively, below or above a breakpoint, the amplifier being formed with signal combination circuits by which both the breakpoint and the gain factor above the breakpoint are variable for the adaptive signal compression, a smaller gain factor being present above the breakpoint in the case of a breakpoint corresponding to a higher input signal voltage, characterized in that the signal amplifier operative with an adaptive white signal compression for a picture signal is formed with signal combination circuits in the form of a signal multiplier circuit for multiplying a picture voltage and a first substantially constant direct voltage, respectively, by a control voltage, and a signal minimum detection circuit for passing the lowest of either said picture voltage or the voltage originating from the signal multiplier circuit and relative to a second substantially constant direct voltage, the control voltage being derived via a control circuit from the voltage value that has been passed.

2. An amplifier circuit as claimed in claim 1, characterized in that the signal multiplier circuit is formed with an input for the supply of the picture voltage minus the first substantially constant direct voltage, which picture voltage is supplied by a subtractor circuit as a signal combination circuit, and a further input for the supply of the control voltage, an output of said multiplier circuit being coupled to an input of an adder circuit as a signal combination circuit, another input of which receives the second substantially constant direct voltage and an output of which is coupled to an input of the signal minimum detection circuit, another input of which receives said picture voltage.

3. An amplifier circuit as claimed in claim 1, characterized in that the signal multiplier circuit is formed with emitter-coupled transistors whose bases are connected to respective inputs thereof, with a current source transistor connected to the emitters and with a current-mirror output, the control voltage being applied to the current source transistor and the current-mirror circuit output being connected via a resistor to a voltage terminal carrying the second constant direct voltage, said current-mirror circuit output being furthermore connected to an input of the signal minimum detection circuit.

4. An amplifier circuit as claimed in any one of the preceding claims, characterized in that the signal minimum detection circuit is formed with two transistors having parallel connected emitters and collectors, the bases constituting the inputs of the signal minimum detection circuit and the emitters being connected via a resistor to a supply voltage terminal, said emitters being connected to the output of the signal minimum detection circuit.

5. An amplifier circuit as claimed in claim 4, characterized in that the output of the signal minimum detection circuit with the emitter connection is connected to an emitter of a transistor which is disposed in the control circuit for applying said control voltage to an output, the base of said transistor being connected to a terminal carrying a reference direct voltage and the collector being connected to a signal-integrating circuit whose output consistutes the output of the control circuit.

6. An amplifier circuit as claimed in claim 4, characterized in that an emitter-follower output of the signal minimum detection circuit with the emitter connection is connected to a base of a first transistor disposed in the control circuit for applying the said control voltage to an output, the emitter of said first transistor being connected to the emitter of a second transistor, the control circuit including a third transistor, the bases of the second and third transistors being connected to a terminal carrying a reference direct voltage, the emitters of the first and second transistors and the emitter of the third transistor being connected to respective inputs of a differential amplifier forming part of a signal-integrating circuit whose output constitutes the output of the control circuit.

7. An amplifier circuit as claimed in claim 5 suitable for use in colour television, characterized in that the amplifier circuit includes at least two signal channels each comprising the signal multiplier circuit and the minimum detection circuit, the control circuit being formed with an input for each signal channel, each with the associated transistor, the collectors of said transistors being connected together.

8. An amplifier circuit as claimed in claim 5, characterized in that the signal-integrating circuit is formed with a differential amplifier and a capacitor between an amplifier input and output and that the relevant amplifier input is connected via a variable resistor to a supply voltage terminal.

9. An amplifier circuit as claimed in claim 5, characterized in that the discharge time constant of the signal-integrating circuit is of the order of several television field periods.

* * * * *

UNITED STATES PATENT AND TRADEMARK OFFICE
CERTIFICATE OF CORRECTION

PATENT NO. : 4,757,373
DATED : July 12, 1988
INVENTOR(S) : Johannes H.J.M. Van Rooy It is certified that error appears in the above-identified patent and that said Letters Patent is hereby corrected as shown below:

Claim 3, line 9    after "second" insert

--substantially--

Signed and Sealed this

Twenty-eighth Day of February, 1989

Attest:

DONALD J. QUIGG

*Attesting Officer*      *Commissioner of Patents and Trademarks*